United States Patent [19]

Yoshida

[11] Patent Number: 4,875,944
[45] Date of Patent: Oct. 24, 1989

[54] AMORPHOUS PHOTOELECTRIC CONVERTING DEVICE

[75] Inventor: Takashi Yoshida, Kanagawa, Japan

[73] Assignee: Fuji Electric Corporate Research and Development, Ltd., Japan

[21] Appl. No.: 242,887

[22] Filed: Sep. 9, 1988

[30] Foreign Application Priority Data

Sep. 17, 1987 [JP] Japan .............................. 62-233422

[51] Int. Cl.$^4$ ........................................... H01C 31/06
[52] U.S. Cl. .................................... 136/249; 136/258; 357/30
[58] Field of Search .................. 136/249 TJ, 258 AM; 357/30 J, 30 K, 30 N

[56] References Cited

U.S. PATENT DOCUMENTS

| 4,479,028 | 10/1984 | Sato et al. | 136/249 |
| 4,609,771 | 9/1986 | Guha et al. | 136/249 |
| 4,737,196 | 4/1988 | Yukimoto | 136/249 |
| 4,776,894 | 10/1988 | Watanabe et al. | 136/249 |

FOREIGN PATENT DOCUMENTS

| 58-122783 | 7/1983 | Japan | 136/249 TJ |
| 60-9178 | 1/1985 | Japan | 136/249 TJ |
| 61-104678 | 5/1986 | Japan | 136/249 TJ |
| 63-17567 | 1/1988 | Japan | 136/249 TJ |

Primary Examiner—Aaron Weisstuch
Attorney, Agent, or Firm—Brumbaugh, Graves, Donohue & Raymond

[57] ABSTRACT

An amorphous photoelectric converting device that remains efficient despite exposure to heat over long periods of time is formed by placing one on top of the other a plurality of photovoltaic elements each comprising a thin film of p-i-n structure. The p-type layer and the n-type layer of adjacent elements are made of microcrystalline silicon so that good ohmic contact is established, and the p-type layer of microcrystalline silicon contains boron in an amount sufficient to neutralize the donor atoms which diffuse from the adjacent n-type layer when the device is left to stand at high temperatures for a long period of time. The amount of boron, however, is limited to such an extent that the boron atoms do not adversely affect the initial desired characteristics of the device. A preferred range of boron levels is $3 \times 10^{20}$ to $1 \times 10^{21}$ atoms/cm$^3$.

7 Claims, 1 Drawing Sheet

AMORPHOUS PHOTOELECTRIC CONVERTING DEVICE

BACKGROUND OF THE INVENTION

The present invention relates to an amorphous photoelectric converting device in which a plurality of semiconductor thin films or elements of p-i-n structure are placed one on top of the other in the direction perpendicular to the bonded surface, such as in a multijunction solar cell.

Solar cells and photosensors are among the applications of a photovoltaic element composed of an amorphous semiconductor film, especially an amorphous silicon (a-Si:H) film formed through decomposition of a silane gas by glow discharge or ultraviolet light. Current research relating to solar cells is aimed at the improvement of their conversion efficiency and reliability, which is necessary for the cells to be put to practical use.

A multijunction solar cell is known to generate a high output voltage. It is made up of a-Si:H elements, each element having the p-i-n structure, as shown in FIG. 2. In FIG. 2 there are shown a transparent substrate 1, a transparent electrode layer 2; a first element composed of a first p-type layer 31, a first i-type layer 41, and a first n-type layer 51; a second element composed of a second p-type layer 32, a second i-type layer 42, and a second n-type layer 52, and a reverse metal electrode layer 6, which are placed one on top of the other. The adjacent first n-type layer 51 and second p-type layer 32 are both made of microcrystalline silicon ($\mu$C-Si:H) which permits increased contact between the two layers. Additionally, a positive terminal 21 is formed on the exposed surface of the transparent electrode layer 2.

A solar cell of this type is improved in efficiency if the second i-type layer 42 is made of a material having a narrower optical band width than that for the first i-type layer 41. For example, a solar cell having a first i-type layer of a-Si:H and a second i-type layer of a-SiGe:H can utilize sunlight more efficiently. Further studies are being made on solar cells of multiple layer type formed by laminating together or more units of p-i-n structure.

Unfortunately, the solar cell of multiple layer type suffers from a disadvantage that when it is allowed to stand at high temperatures for a long time, it becomes seriously deteriorated in characteristic properties such as open circuit voltage, curve factor, and conversion efficiency. The deterioration is caused by the diffusion of impurities into the interface between the n-type semiconductor layer of one element and the p-type semiconductor layer of the other adjacent element. The diffused impurities impair the interfacial ohmic contact between the two adjacent layers.

SUMMARY OF THE INVENTION

It is thus an object of the present invention to provide an amorphous photoelectric converting device of multi-junction type which is free of the above-mentioned disadvantage. Even after being exposed to high temperature for a long period of time, the claimed converting device does not suffer deterioration of photoelectric converting characteristics by the degradation of ohmic contact between the adjacent p-type layer and n-type layer of consecutive layered photovoltaic elements of p-i-n structure.

The obove-mentioned object is achieved by an amorphous photoelectric converting device comprising a plurality of photovoltaic elements laminated one on top of the other, each of said elements being made up of thin films of p-type layer, i-type layer, and n-type layer and having the p-i-n structure, with the n-type layer and p-type layer of adjacent elements being made of microcrystalline silicon and the remaining other layers being made of amorphous silicon, wherein the concentration of boron in said p-type layer of microcrystalline silicon ($\mu$C-Si:H) ranges from $3 \times 10^{20}$ to $2 \times 10^{21}$ atoms/cm$^3$.

DESCRIPTION OF THE PREFERRED EMBODIMENT

According to the present invention, the p-type layer of $\mu$C-Si:H in each element contains a sufficient amount of boron (B) so as to protect the ohmic contact between layers from becoming deteriorated by the diffusion of donor impurities, such as phosphorus (P) from the n-type layer of the adjacent element, even when the device is allowed to stand at high temperatures for a long period of time. The upper limit of the boron concentration is established so that the initial desired characteristics are not adversely affected by boron.

Figure 1:
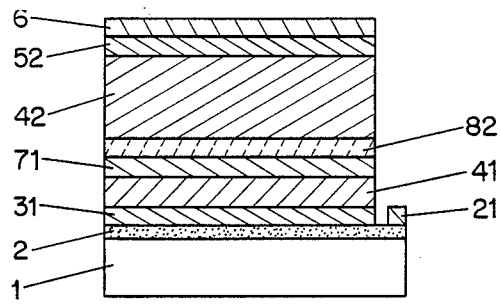
FIG. 1 is a sectional view showing an embodiment of the present invention.
Figure 2:
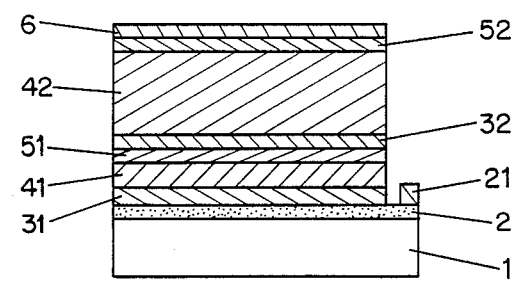
FIG. 2 is a sectional view showing a conventional device.

An embodiment of the present invention will be described with reference to FIG. 1, in which the same reference characters are used for the corresponding parts in FIG. 2. An amorphous silicon solar cell shown in FIG. 1 was made up of a transparent glass substrate 1, a transparent conductive film layer 2 of indium tin oxide (ITO) or SnO$_2$, a p-type amorphous silicon carbide (a-SiC:H) layer 31 having a large band gap, an i-type a-Si:H layer 41, an n-type $\mu$C-Si:H layer 71, a p-type $\mu$C-Si:H layer 82 in which the boron concentration is limited to between $3 \times 10^{20}$ to $2 \times 10^{21}$ atoms/cm$^3$, preferably $5 \times 10^{20}$ to $1 \times 10^{21}$ atoms/cm$^3$, an i-type a-Si:H layer 42, an n-type a-Si:H layer 52, and a back electrode 6, which are formed one on top of the other.

Figure 3:
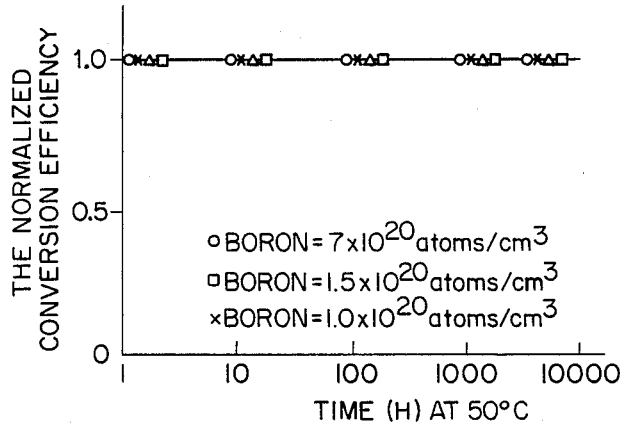
FIGS. 3 and 4 are graphs showing the relationship between the boron concentration in the p-type layer and the change with time of the normalized efficiency that takes place when the device is allowed to stand at 50° C. and 140° C. for a long time.
Figure 4:
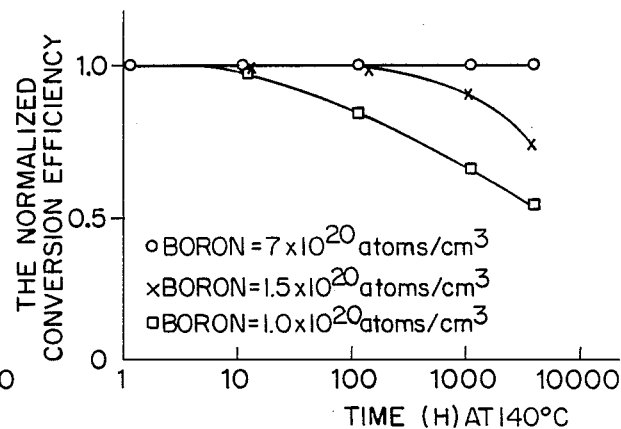

The amorphous silicon solar cell constructed as mentioned above was allowed to stand at 50° C. and 140° C. for 3000 hours to see how it changes in characteristic properties. For comparison, the same experiment as above was carried out with a conventional amorphous silicon solar cell in which the p-type $\mu$C-Si:H layer 82 contains less than 1% of boron. FIGS. 3 and 4 show a part of the results of the experiments. The boron concentration is indicated by a circle sign for $7 \times 10^{20}$ atoms/cm$^3$, by a cross sign for $1.5 \times 10^{20}$ atoms/cm$^3$, and by a square sign for $1.0 \times 10^{20}$ atoms/cm$^3$. The effect of the boron concentration is shown in terms of the change with time of the normalized efficiency for the initial conversion efficiency. In the experiment at 50° C. as shown in FIG. 3, the conversion efficiency remained unchanged over the period tested. In the experiment at 140° C. as shown in FIG. 4, as the boron concentration was decreased, the more the conversion efficiency decreased with time.

Figure 5:
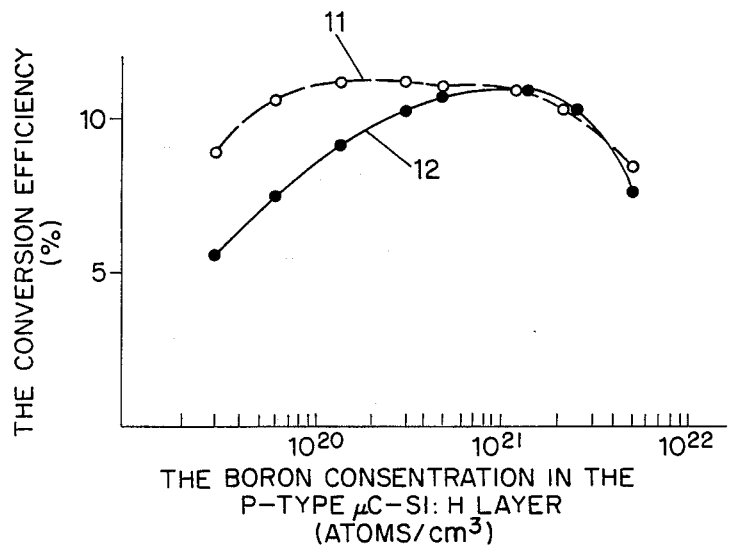
FIG. 5 is a graph showing the relationship between the boron concentration in the p-type layer and the conversion efficiency before and after standing at 140° C. for 3000 hours.

FIG. 5 shows the relation between the conversion efficiency and the boron concentration in the p-type $\mu$C-Si:H layer. In FIG. 5, the broken line 11 represents the initial conversion efficiency, and the solid line 12 represents the conversion efficiency after standing at 140° C. for 3000 hours. It is noted that if the boron concentration in the p-type $\mu$C-Si:H layer is $3 \times 10^{20}$ to $2 \times 10^{21}$ atoms/cm$^3$, the conversion efficiency after 3000 hours is higher than 10%, and that if the boron concentration in the p-type $\mu$C-Si:H layer is $5 \times 10^{20}$ to $1 \times 10^{21}$ atoms/cm$^3$, the conversion efficiency after 3000 hours remains higher than 11%. With the boron concentration higher than $2 \times 10^{21}$ atoms/cm$^3$, the initial conversion efficiency is low and hence the conversion ratio after 3000 hours is also low.

The foregoing indicates that the solar cell in this example withstands the high temperature test at 140° C. for 3000 hours if the boron concentration is in the range of $3 \times 10^{20}$ atoms/cm$^3$ to $2 \times 10^{21}$ atoms/cm$^3$. The concept of the present invention may be applied to a solar cell in which the p-type $\mu$C-Si:H layer is made from hydrogenated silicon such as SiH$_4$ and Si$_2$H$_6$ or from fluorinated silicon such as Si$_2$H$_2$F$_4$ and SiF$_4$, and also to a solar cell in which the p-type layer forming the interface is a microcrystalline silicon germanium film.

Figure 6:
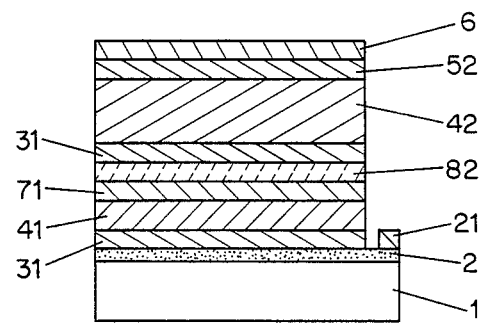
FIG. 6 is a sectional view showing another embodiment of the present invention.

Another embodiment of the present invention is shown in FIG. 6. It differs from the first one shown in FIG. 1 in that the p-type layer forming the interface between the first layer element and the second layer element is of double layer structure. In other words, the p-type layer is formed from two sublayers, a first sublayer 82 which comprises boron doped $\mu$C-silicon and a second sublayer 31 which comprises a material such as a-SiC:H that has a band gap greater than a-Si:H. This structure produces the effect of increasing the photoelectric conversion efficiency of the p-i-n junction forming the second layer element.

I claim:

1. An amorphous photoelectric converting device comprising a plurality of photovoltaic elements laminated one on top of the other, each of said elements comprising a p-type layer, an i-type layer, and an n-type layer and having a p-i-n structure with the n-type layer and p-type layer of consecutive elements being adjacent to one another, wherein the adjacent n-type layers and p-type layers of consecutive elements comprise microcrystalline silicon and the remaining layers comprise amorphous silicon, and wherein said p-type layers of microcrystalline silicon are doped with boron, at a concentration ranging from $3 \times 10^{20}$ to $2 \times 10^{21}$ atoms/cm$^3$.

2. The converting device of claim 1, wherein the concentration of boron ranges from $5 \times 10^{20}$ to $1 \times 10^{21}$ atoms/cm$^3$.

3. The converting device of claim 1, wherein the p-type microcrystalline silicon layer is made from hydrogenated or fluorinated silicon.

4. The converting device of claim 3, wherein the p-type microcrystalline silicon layer is made by decomposition of a material selected from the group consisting of SiH$_4$, Si$_2$H$_6$, Si$_2$H$_2$F$_4$, and SiF$_4$.

5. The converting device of claim 1, wherein the p-type microcrystalline layer of at least one photovoltaic element comprises two p-type sublayers, a first sublayer disposed adjacent to the n-type layer of an adjacent photovoltaic element and comprising microcrystalline silicon doped with boron, and a second sublayer disposed between the first sublayer and the adjacent i-type layer of the element and comprising an amorphous material having a band gap greater than amorphous hydrogenated silicon.

6. The converting device of claim 5, wherein the second sublayer comprises amorphous hydrogenated silicon carbide.

7. An amorphous photoelectric converting device comprising a plurality of photovoltaic elements laminated one on top of the other, each of said elements comprising a p-type layer, and i-type layer, and an n-type layer and having a p-i-n structure, with the n-type layer and p-type layer of consecutive elements being adjacent to one another, wherein the adjacent n-type layer comprises microcrystalline silicon, the adjacent p-type layer comprises microcrystalline silicon germanium doped with boron at a concentration ranging from $3 \times 10^{20}$ to $2 \times 10^{21}$ atoms/cm$^3$, and the remaining layers comprise amorphous silicon.

* * * * *